US008463759B2

(12) United States Patent
Johnson

(10) Patent No.: US 8,463,759 B2
(45) Date of Patent: Jun. 11, 2013

(54) METHOD AND SYSTEM FOR COMPRESSING DATA

(75) Inventor: Carl Eric Johnson, Aubrey, TX (US)

(73) Assignee: CA, Inc., Islandia, NY (US)

( * ) Notice: Subject to any disclaimer, the term of this patent is extended or adjusted under 35 U.S.C. 154(b) by 554 days.

(21) Appl. No.: 12/029,943

(22) Filed: Feb. 12, 2008

(65) Prior Publication Data

US 2009/0083267 A1    Mar. 26, 2009

Related U.S. Application Data

(60) Provisional application No. 60/974,716, filed on Sep. 24, 2007.

(51) Int. Cl.
 *G06F 17/00* (2006.01)
(52) U.S. Cl.
 USPC .......................................................... 707/693
(58) Field of Classification Search
 USPC .......................................................... 707/693
 See application file for complete search history.

(56) References Cited

U.S. PATENT DOCUMENTS

| | | | | |
|---|---|---|---|---|
| 5,406,278 A * | 4/1995 | Graybill et al. | ................. | 341/51 |
| 5,893,094 A * | 4/1999 | Horowitz | ............................... | 1/1 |
| 6,012,057 A * | 1/2000 | Mayer et al. | ........................... | 1/1 |
| 6,226,628 B1 * | 5/2001 | Forbes | ........................... | 707/693 |
| 6,392,567 B2 * | 5/2002 | Satoh | ............................... | 341/51 |
| 6,418,478 B1 | 7/2002 | Ignatius et al. | ............... | 709/240 |
| 6,542,972 B2 | 4/2003 | Ignatius et al. | ............... | 711/154 |
| 6,618,728 B1 * | 9/2003 | Rail | ..................................... | 1/1 |
| 6,657,564 B2 * | 12/2003 | Malik | ............................. | 341/51 |
| 6,658,436 B2 | 12/2003 | Oshinsky et al. | ............. | 707/204 |
| 6,760,723 B2 | 7/2004 | Oshinsky et al. | ................. | 707/3 |
| 6,906,644 B2 * | 6/2005 | Satoh | .............................. | 341/51 |
| 7,051,126 B1 * | 5/2006 | Franklin | ......................... | 710/68 |
| 7,209,972 B1 | 4/2007 | Ignatius et al. | ............... | 709/231 |
| 7,355,608 B1 * | 4/2008 | Beach | ........................... | 345/629 |
| 7,443,321 B1 * | 10/2008 | Kaufman et al. | ............... | 341/87 |
| 7,477,166 B2 * | 1/2009 | McCanne et al. | ............... | 341/50 |
| 7,836,099 B2 * | 11/2010 | Ravikumar et al. | ........... | 707/803 |
| 7,979,403 B2 * | 7/2011 | Kedem et al. | ................. | 707/693 |

\* cited by examiner

*Primary Examiner* — Fred I Ehichioya
*Assistant Examiner* — Michelle Owyang
(74) *Attorney, Agent, or Firm* — Baker Botts, LLP

(57) ABSTRACT

The present disclosure is directed to a method and system for compressing data. In accordance with a particular embodiment of the present disclosure, at least one data string is received. The at least one data string includes characters. A token string corresponding to the at least one data string is generated. At least one repeated substring in the at least one data string is identified. A refer-back token associated with the at least one repeated substring is generated. The refer-back token indicates a position of the at least one repeated substring and a length of the at least one repeated substring.

20 Claims, 3 Drawing Sheets

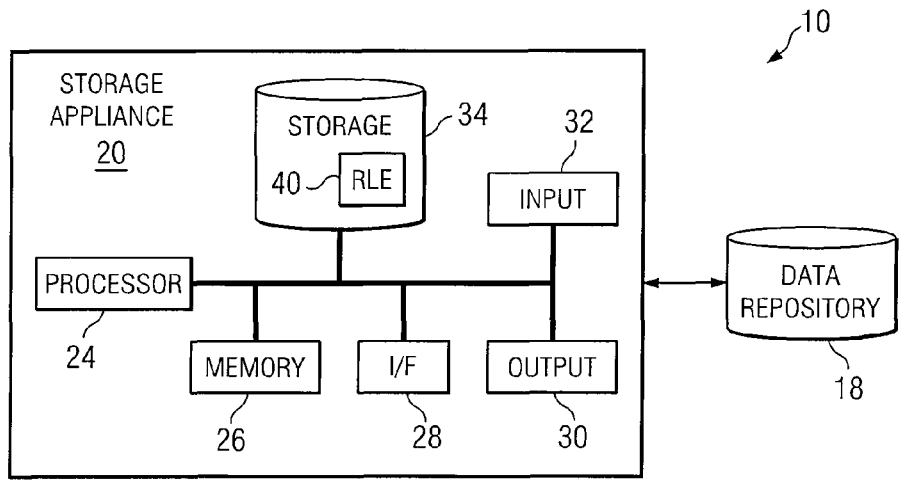

| TOKEN ID | MEANING |
|---|---|
| 102 — B'000.....' | Short exact string follows up to 32 bytes |
| 104 — B'001.....' | Long exact long string follows up to 8192 bytes |
| 106 — B'0100.....' | Short refer-back token with 2 byte refer-back offset following |
| 108 — B'0101.....' | Short refer-back token with 1 byte refer-back offset following |
| 110 — B'0110.....' | Long refer-back token (12 bit length) with 2 byte refer-back offset following |
| 112 — B'0111.....' | Long refer-back token (12 bit length) with 1 byte refer-back offset following |
| 114 — B'1000.....' | Short X'00' repeat up to 16 bytes |
| 116 — B'1001.....' | Long X'00' long repeat up to 4096 bytes |
| 118 — B'1010.....' | Short X'40' (blank character) repeat up to 16 bytes |
| 120 — B'1011.....' | Long X'40' (blank character) long repeat up to 4096 bytes |
| 122 — B'1100.....' | Short X'F0' (zero character) repeat up to 16 bytes |
| 124 — B'1101.....' | Long X'F0' (zero character) long repeat up to 4096 bytes |
| 126 — B'1110.....' | Short repeating character follows token header byte |
| 127 — B'1111.....' | Long repeating character follows token header byte |

METHOD AND SYSTEM FOR COMPRESSING DATA

CROSS REFERENCE TO RELATED APPLICATIONS

This application claims the benefit of priority under 35 U.S.C. §119(e) of U.S. Provisional Patent Application Ser. No. 60/974,716 entitled "Method and System for Improving Data Compression," which was filed on Sep. 24, 2007 and is herein incorporated by reference.

TECHNICAL FIELD

The present disclosure relates generally to data compression, and more particularly to a method and system for compressing data.

BACKGROUND

Conventional mainframe systems often store large volumes of data on tapes. Tapes may be used for archival purposes as well as a primary storage medium for some mainframe systems. Numerous attempts to create an easy-to-use mechanism to compress tape data, however, have significant limitations. For example, magnetic tape hardware may have data compression incorporated, but the tape hardware fails to compress the data efficiently.

SUMMARY

The present disclosure is related to a method and system for compressing data. The teachings of the present disclosure allow data to be compressed in an efficient manner.

In accordance with a particular embodiment of the present disclosure, a method for compressing data includes receiving at least one data string. The data string includes characters. The method also includes generating a token string corresponding to the data string. The method further includes identifying at least one repeated substring in the data string. The method further includes generating a refer-back token associated with the repeated substring. The refer-back token indicates a relative position of the repeated substring and a length of the repeated substring.

Technical advantages of particular embodiments of the present disclosure include a system and method for compressing data that efficiently compresses tape data by identifying repeated substrings. Thus, tape utilization may be substantially improved.

Further technical advantages of particular embodiments of the present disclosure include a system and method for compressing data that improves on the Run Length Encoding (RLE) method for data compression. The system and method expand upon basic RLE by addressing the data strings that are considered uncompressible by the basic RLE algorithm. The improved RLE method may reduce the number of tapes required by storage administrators to store data.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its features and advantages, reference is now made to the following description, taken in conjunction with the accompanying drawings, in which:

FIG. 1 is a block diagram illustrating a system for compressing data, according to one embodiment of the present disclosure;

FIG. 2 is a diagram illustrating example token notations, according to one embodiment of the present disclosure;

FIG. 3A is a diagram illustrating example source data to be compressed, according to one embodiment of the present disclosure;

FIG. 3B is a diagram illustrating an example output of the source data of FIG. 3A using a basic Run Length Encoding method, according to one embodiment of the present disclosure;

FIG. 3C is a diagram illustrating an example output of the source data of FIG. 3A using an improved Run Length Encoding method, according to one embodiment of the present disclosure.

DETAILED DESCRIPTION OF THE DRAWINGS

Figure 4:
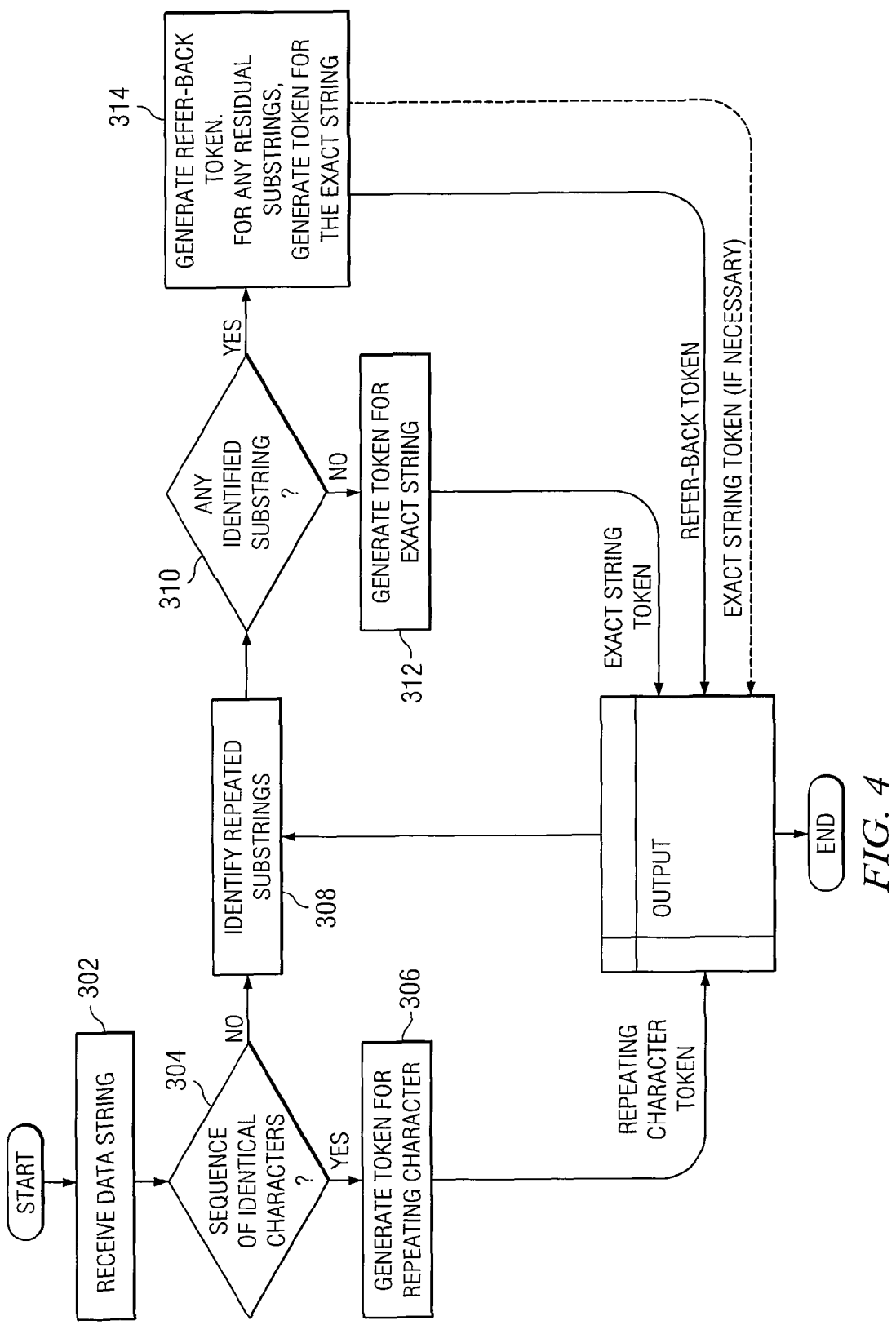
FIG. 4 is a flow diagram illustrating a method for compressing data, according to one embodiment of the present disclosure.

Storage management has generally referred to managing data on tape and disk devices. On a mainframe, tapes may be used for both backup and disaster-recovery purposes. While some specific products (for example, with respect to backup products) have started to address data compression for these purposes, they are often less than ideal.

For example, one commonly used method to compress data is the basic Run Length Encoding (RLE) method. The basic RLE method operates on one block of data at a time. The basic RLE method compresses data by replacing a sequence of identical characters with a token that indicates the character to be repeated and a repetition factor. The remaining text is considered uncompressible and is tokenized by prefixing the text with a length code. The basic RLE method also produces output blocks consisting of a series of tokens. Each token represents either a repeating character or an exact text string. Therefore, the basic RLE method improves tape utilization but generally provides minimal compression because the remaining text is considered uncompressible. Thus, what is needed is a method that improves the compression by compressing the text that is considered uncompressible by the basic RLE method.

In accordance with the teachings of the present disclosure, a method for compressing data includes an improved RLE method that addresses repeating substrings. The object of this new method is to reduce the size of the exact text tokens and still have 100% lossless data compression. Tokens representing a sequence of repeating characters are processed. The remaining exact text that would have been output directly under a basic RLE method is analyzed before placing it in the output as described in more detail below.

According to one embodiment of the present disclosure, the exact text is compared to data that has already been placed in the compression output. If any portion of the text matches data that has already been placed in the output, a refer-back token is generated that indicates how far back in the output and for what length the substring occurred. In other words, these refer-back tokens refer to data already placed in the output. Any portion of the text that does not match previous data is written out as exact text tokens. According to one embodiment, this improved data compression method may increase data compression from 56% to 68%. Additionally, there is no table or dictionary required for expansion (decompression) since the compressed data block contains everything necessary for expansion.

The method and system for compressing data identified in this disclosure are not limited to any specific system. The examples illustrated in the accompanying figures will be described with reference to systems with tape storage devices. However, other well-known storage systems may also be used.

FIG. 1 is a block diagram illustrating a system 10 for compressing data, according to one embodiment of the present disclosure. As shown in the illustrated embodiment, system 10 generally includes a data repository 18 and a storage appliance 20.

Data repository 18 may refer to any suitable device operable for storing compressed data. Although FIG. 1 provides one example of data repository 18 as operating separate from storage appliance 20, in other embodiments data repository 18 may operate within storage appliance 20. Data repository 18 may include, for example, a magnetic disk, flash memory, optical disk, or other suitable data storage device. According to one embodiment of the present disclosure, data repository 18 may be a tape storage device.

Storage appliance 20 may refer to any suitable device operable to store compressed data at data repository 18. According to the illustrated embodiment, storage appliance 20 includes a processor 24, a memory device 26, a communication interface (I/F) 28, an output device 30, an input device 32, a storage device 34, and a Run Length Encoding (RLE) component 40.

RLE component 40 may refer to any suitable logic embodied in computer-readable media, and when executed, that is operable to improve data compression. In the illustrated embodiment of the disclosure, RLE component 40 resides in storage device 34. In other embodiments of the disclosure, RLE component 40 may reside in memory device 26, or any other suitable device operable to store and facilitate retrieval of data and instructions.

According to one embodiment of the disclosure, RLE component 40 improves on a basic RLE method by improving identification of repeating portions of the text. RLE component 40 generates a token that indicates how far back in the output and for what length that portion is located. As described above, these tokens are referred to as refer-back tokens. Any portion of the text that does not match previously output data is written out as exact text tokens.

According to one embodiment of the disclosure, RLE component 40 may identify repeating portions by searching text in a buffer for a repeated substring. For example, if RLE component 40 identifies two characters in sequence that match in a particular string, the chances of finding a match for the entire text string are substantially increased. Once located, RLE component 40 may determine how many bytes match. If the string is compressible, RLE component 40 may generate a refer-back token for the string or any part thereof. If an actual match is found for the entire text string, then there is a high probability the entire text string may be found again, so the identified portion may be stored with any suitable reference number by RLE component 40. However, the present disclosure contemplates many techniques for identifying repeated substrings in a buffer. Additional details of additional components of storage appliance 20 are provided below.

Processor 24 may refer to any suitable device operable to execute instructions and manipulate data to perform operations for application storage appliance 20. Processor 24 may include, for example, any type of central processing unit (CPU).

Memory device 26 may refer to any suitable device operable to store and facilitate retrieval of data. Memory device 26 may comprise Random Access Memory (RAM), Read Only Memory (ROM), a magnetic drive, a disk drive, a Compact Disk (CD) drive, a Digital Video Disk (DVD) drive, removable media storage, any other suitable data storage medium, or a combination of any of the preceding.

Communication interface (I/F) 28 may refer to any suitable device operable to receive input for storage appliance 20, send output from storage appliance 20, perform suitable processing of the input or output or both, communicate to other devices, or any combination of the preceding. Communication interface 28 may include appropriate hardware (e.g. modem, network interface card, etc.) and software, including protocol conversion and data processing capabilities, to communicate through a LAN, WAN, or other communication system that allows storage appliance 20 to communicate to other devices. Communication interface 28 may include one or more ports, conversion software, or both.

Output device 30 may refer to any suitable device operable for displaying information to a user. Output device 30 may include, for example, a video display, a printer, a plotter, or other suitable output device. In other embodiments, output device 30 may include a magnetic disk, flash memory, optical disk, or other suitable data storage device.

Input device 32 may refer to any suitable device operable to input, select, and/or manipulate various data and information. Input device 32 may include, for example, a keyboard, mouse, graphics tablet, joystick, light pen, microphone, scanner, or other suitable input device. In other embodiments, input device 32 may include a magnetic disk, flash memory, optical disk, or other suitable data storage device.

Storage device 34 may refer to any suitable device operable for storing data and instructions. Storage device 34 may include, for example, a magnetic disk, flash memory, optical disk, or other suitable data storage device.

Figures 3A, 3B, 3C:
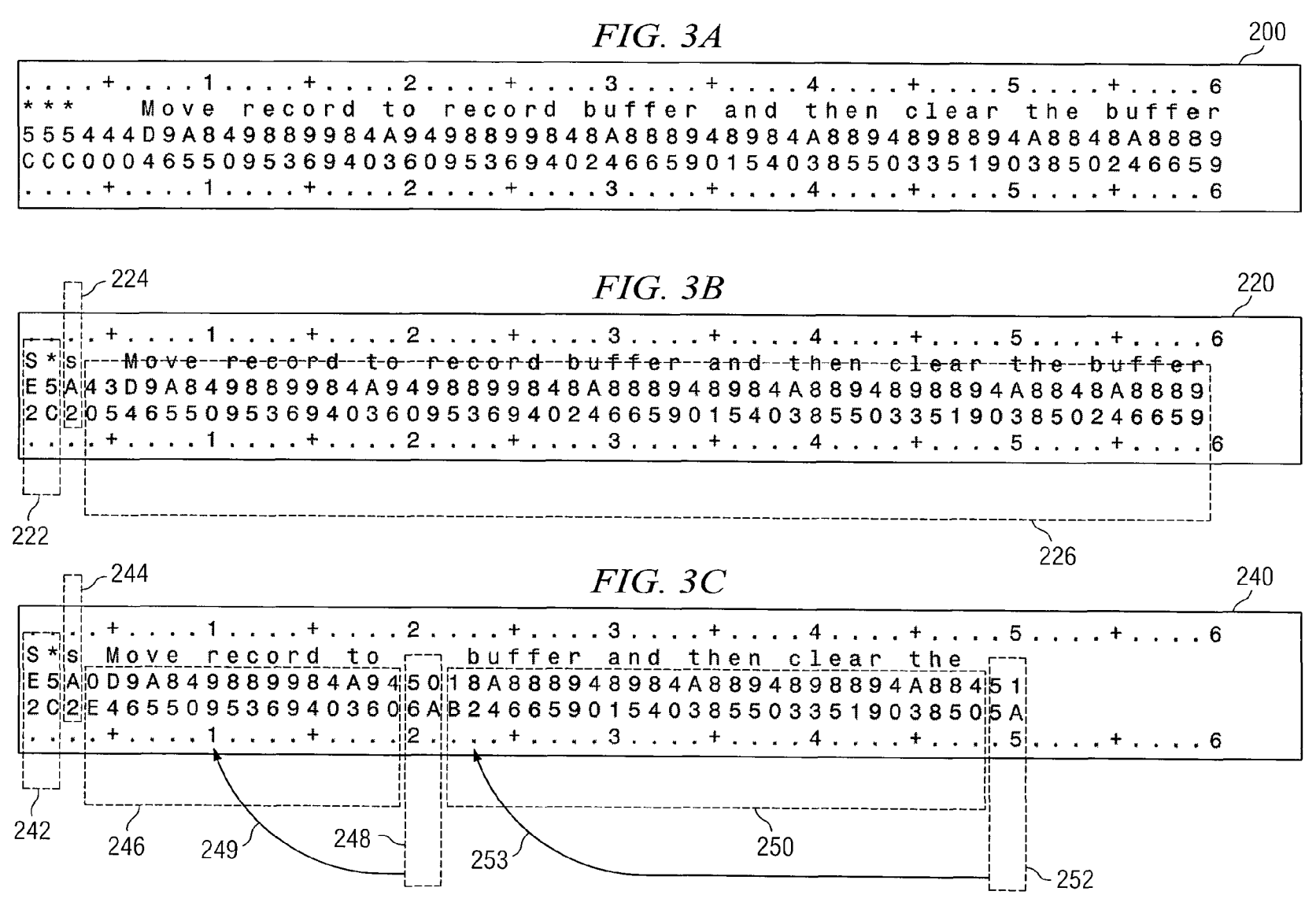

FIG. 2 is a diagram illustrating example token notations 100, according to one embodiment of the present disclosure. In the illustrated embodiment, token notations 100 includes a token ID field that identifies a particular token and a meaning field that identifies the association of the respective token ID. For example, the token IDs in the illustrated embodiment may correspond to characters in a data string, as described in more detail below with reference to FIGS. 3A-3C. In the illustrated embodiment of FIG. 2, the term "short" indicates the token header is contained in one byte and "long" indicates the token header is two bytes. The bits in the header that are not used to designate the type of token are the length bits. For example, exact string tokens use 3 bits to indicate the token type, as indicated by reference numbers 102 and 104, so 5 bits remain to include as the length. Other tokens, such as those indicated by reference numbers 106-127 use 4 bits to identify the token type so only 4 bits remain for the length. For "long" tokens, the next byte is used to continue the length. Long string tokens have a 13-bit length while all other long tokens have a 12-bit length. The length value is expressed relative to zero. That is, the length is coded as the actual number of bytes minus one.

According to one embodiment of the disclosure, the tokens for repeating characters in this example may be optimized for an Extended Binary Coded Decimal Interchange Code (EBCDIC) character set and typical business data. The hexadecimal "00" character, the blank character, and the zero character are frequent characters in a repeating sequence. However, various embodiments of the present disclosure may easily be adapted to other character sets by determining the characters that are most likely to appear in a repeating sequence and assign the special, compact repeating token IDs to those characters.

FIG. 3A is a diagram illustrating example source data 200 to be compressed, according to one embodiment of the present disclosure. As shown in FIG. 3A, source data 200 includes a string of characters and a representation of the string of characters in vertical hexadecimal notation underneath the string of characters.

FIG. 3B is a diagram illustrating an example output 220 of the source data of FIG. 3A using a basic RLE method, according to one embodiment of the present disclosure. As shown in FIG. 3B, the three asterisks are compressed to a two byte token, as indicated by reference number 222. The three blanks are compressed to a one-byte token, as indicated by reference number 224. The exact string is longer than 32 bytes so it is identified by an exact text token with a long string token header to express the 54-byte exact text string, as indicated by reference number 226. As shown in FIG. 3B, all other text is considered uncompressible and exact text token 226 is generated with a token header to indicate the length of the exact text token 226. In the illustrated embodiments of FIGS. 3A and 3B, source data 200 has a first byte length and example output 220 has a second byte length, and the first byte length of source data 200 is greater than the second byte length of example output 220.

FIG. 3C is a diagram illustrating an example output 240 of the source data of FIG. 3A using an improved RLE method, according to one embodiment of the present disclosure. As shown in FIG. 3C, the three asterisks are compressed to a two byte token, as indicated by reference number 242. The three blanks are compressed to a one byte token, as indicated by reference number 244. The exact string "Move record to" is less than 32 bytes so it is identified by an exact text token with a short string token header to express the 15 byte exact text string, as indicated by reference number 246.

According to one embodiment of the disclosure, the improved RLE method may identify the repeated substring "record" (with a trailing space) in the data string. A refer-back token 248 is generated that is associated with the substring. For example, the hexadecimal "56" in the refer-back token identifies a short refer-back token with a 1 byte refer-back offset. The refer-back token indicates that the repeated substring is 7 bytes long and is 10 bytes back in the compressed record, as indicated by reference number 249.

An exact string 26 bytes long is identified by an exact text token, as indicated by reference number 250. According to one embodiment of the disclosure, the improved RLE method may identify the repeated substring "buffer" in the data string. A short refer-back token is generated with short refer-back offset is indicated by reference number 252. The refer-back token indicates that the repeated substring is 6 bytes long and appears 26 bytes back from this point referring to "buffer" as indicated by reference number 253. In the illustrated embodiments of FIGS. 3B and 3C, example output 220 has a first byte length and example output 240 has a second byte length, and the first byte length of example output 220 is greater than the second byte length of example output 240.

Thus, particular embodiments of the present disclosure improve compression by compressing the text that is considered uncompressible by the basic RLE method. Compression is improved by identifying and compressing repeating substrings. By identifying and compressing repeated substrings, tape utilization for storage systems may be substantially improved. For example, the improved compression may reduce the number of tapes required by storage administrators to store data.

FIG. 4 is a flow diagram illustrating a method for compressing data, according to one embodiment of the present disclosure. The method begins at step 302 where at least one data string is received. For example, the at least one data string may include characters. At step 304, it is determined whether there is a sequence of identical characters in the data string. If there is a sequence of identical characters, a token is generated for the output at step 306. According to one embodiment of the disclosure, at step 308 the improved RLE method identifies repeated substrings in the at least one data string. At step 310, it is determined whether a repeated substring exists in the data string. If there is not a repeated substring, a token for the exact string is generated at step 312 for the output. If there is a repeated substring, a refer-back token is generated at step 314 for the output. For example, the refer-back token may indicate a position of the at least one repeated substring and a length of the at least one repeated substring in the output. For any residual substrings, an exact string token may also be generated at step 314 for the output.

It should be understood that some of the steps illustrated in FIG. 4 may be combined, modified or deleted where appropriate, and additional steps may also be added to the flowchart. Additionally, as indicated above, steps may be performed in any suitable order without departing from the scope of the disclosure.

Numerous other changes, substitutions, variations, alterations and modifications may be ascertained by those skilled in the art and it is intended that the present disclosure encompass all such changes, substitutions, variations, alterations and modifications as falling within the spirit and scope of the appended claims. Moreover, the present disclosure is not intended to be limited in any way by any statement in the specification that is not otherwise reflected in the claims.

What is claimed is:

1. A method for compressing data, comprising:
receiving at least one data string, the at least one data string comprising a plurality of substrings, each substring comprising a plurality of characters;
identifying a first substring in the at least one data string, the first substring comprising a plurality of characters that are the same as a plurality of characters of a second substring in the at least one data string;
generating, by one or more processors, a refer-back token associated with the second substring, the refer-back token indicating a position of the first substring within a token string, the token string being a compressed version of at least a portion of the at least one data string, the position indicated by the refer-back token expressed as an offset to a position of the refer-back token in the token string, the refer-back token further indicating a length of the first substring within the token string, the refer-back token including a header that specifies a number of bits used to store the offset expressed by the position indicated by the refer-back token;
placing the first substring and the refer-back token into the token string, the token string allowing the second substring to be reconstructed by accessing the refer-back token, moving to the position in the token string that is indicated by the refer-back token, and reading an amount of data according to the length indicated by the refer-back token;
identifying a third substring in the at least one data string, the third substring comprising a plurality of characters that are the same as a plurality of characters of a fourth substring in the at least one data string;
generating a second refer-back token associated with the third substring, the second refer-back token indicating a position of the fourth substring within the token string, the position indicated by the second refer-back token expressed as an offset to a position of the second refer-back token in the token string, the second refer-back token further indicating a length of the fourth substring within the token string, the second refer-back token including a second header that specifies a second number of bits used to store the offset expressed by the position indicated by the second refer-back token, the second number of bits different from the first number of bits; and placing the fourth substring and the second refer-back token into the token string, the token string allowing the third substring to be reconstructed by accessing the second refer-back token, moving to the position in the token string that is indicated by the second refer-back token, and reading an amount of data according to the length indicated by the second refer-back token.

2. The method of claim 1, wherein: the at least one data string has a first byte length;
the token string has a second byte length; and
the first byte length is greater than the second byte length.

3. The method of claim 1, wherein at least a portion of the token string is generated using Run Length Encoding (RLE).

4. The method of claim 1, further comprising storing the token string.

5. The method of claim 1, wherein identifying at least one repeated substring in the at least one data string comprises identifying at least two matching characters in the at least one data string.

6. The method of claim 1, further comprising storing the first substring.

7. The method of claim 1, wherein the token string comprises a plurality of tokens and at least one token of the plurality of tokens in the token string comprises an exact text token.

8. A system for compressing data, comprising:
a processor; and
a storage device embodying a program of instructions operable, when executed on the processor, to:
receive at least one data string, the at least one data string comprising a plurality of characters;
identify a first substring in the at least one data string, the first substring comprising a plurality of characters that are the same as a plurality of characters of a second substring in the at least one data string;
generate a refer-back token associated with the second substring, the refer-back token indicating a position of the first substring within a token string, the token string being a compressed version of at least a portion of the at least one data string, the position indicated by the refer-back token expressed as an offset to a position of the refer-back token in the token string, the refer-back token further indicating a length of the first substring within the token string, the refer-back token including a header that specifies a number of bits used to store the offset expressed by the position indicated by the refer-back token;
place the first substring and the refer-back token into the token string, the token string allowing the second substring to be reconstructed by accessing the refer-back token, moving to the position in the token string that is indicated by the refer-back token, and reading an amount of data according to the length indicated by the refer-back token;
identify a third substring in the at least one data string, the third substring comprising a plurality of characters that are the same as a plurality of characters of a fourth substring in the at least one data string;
generate a second refer-back token associated with the third substring, the second refer-back token indicating a position of the fourth substring within the token string, the position indicated by the second refer-back token expressed as an offset to a position of the second refer-back token in the token string, the second refer-back token further indicating a length of the fourth substring within the token string, the second refer-back token including a second header that specifies a second number of bits used to store the offset expressed by the position indicated by the second refer-back token, the second number of bits different from the first number of bits; and
place the fourth substring and the second refer-back token into the token string, the token string allowing the third substring to be reconstructed by accessing the second refer-back token, moving to the position in the token string that is indicated by the second refer-back token, and reading an amount of data according to the length indicated by the second refer-back token.

9. The system of claim 8, wherein:
the at least one data string has a first byte length;
the token string has a second byte length; and
the first byte length is greater than the second byte length.

10. The system of claim 8, wherein the program of instructions is further operable to generate at least a portion of the token string using Run Length Encoding (RLE).

11. The system of claim 8, wherein the program of instructions is further operable to store the token string.

12. The system of claim 8, wherein the program of instructions is further operable to identify at least two matching characters in the at least one data string.

13. The system of claim 8, wherein the program of instructions is further operable to store the first substring.

14. The system of claim 8, wherein the token string comprises a plurality of tokens and at least one token of the plurality of tokens in the token string comprises an exact text token.

15. Non-transitory computer readable media comprising logic, the logic being operable, when executed by a processor, to:
receive at least one data string, the at least one data string comprising a plurality of characters;
identify a first substring in the at least one data string, the first substring comprising a plurality of characters that are the same as a plurality of characters of a second substring in the at least one data string;
generate a refer-back token associated with the second substring, the refer-back token indicating a position of the first substring within a token string, the token string being a compressed version of at least a portion of the at least one data string, the position indicated by the refer-back token expressed as an offset to a position of the refer-back token in the token string, the refer-back token further indicating a length of the first substring within the token string, the refer-back token including a header that specifies a number of bits used to store the offset expressed by the position indicated by the refer-back token;
place the first substring and the refer-back token into the token string, the token string allowing the second substring to be reconstructed by accessing the refer-back token, moving to the position in the token string that is indicated by the refer-back token, and reading an amount of data according to the length indicated by the refer-back token;

identify a third substring in the at least one data string, the third substring comprising a plurality of characters that are the same as a plurality of characters of a fourth substring in the at least one data string;

generate a second refer-back token associated with the third substring, the second refer-back token indicating a position of the fourth substring within the token string, the position indicated by the second refer-back token expressed as an offset to a position of the second refer-back token in the token string, the second refer-back token further indicating a length of the fourth substring within the token string, the second refer-back token including a second header that specifies a second number of bits used to store the offset expressed by the position indicated by the second refer-back token, the second number of bits different from the first number of bits; and place the fourth substring and the second refer-back token into the token string, the token string allowing the third substring to be reconstructed by accessing the second refer-back token, moving to the position in the token string that is indicated by the second refer-back token, and reading an amount of data according to the length indicated by the second refer-back token.

16. The non-transitory computer readable media of claim 15, wherein:
the at least one data string has a first byte length;
the token string has a second byte length; and
the first byte length is greater than the second byte length.

17. The non-transitory computer readable media of claim 15, wherein the logic is further operable to generate at least a portion of the token string using Run Length Encoding (RLE).

18. The non-transitory computer readable media of claim 15, wherein the logic is further operable to store the token string.

19. The non-transitory computer readable media of claim 15, wherein the logic is further operable to identify at least two matching characters in the at least one data string.

20. The non-transitory computer readable media of claim 15, wherein the logic is further operable to store the first substring.

\* \* \* \* \*